US012677371B2

(12) United States Patent
    Shim et al.

(10) Patent No.:  US 12,677,371 B2
(45) Date of Patent:      Jul. 7, 2026

(54) SUBSTRATE STRUCTURE CONNECTED ON BASIS OF SOLDER BALL AND ELASTIC BODY

(71) Applicant: Samsung Electronics Co., Ltd., Suwon-si (KR)

(72) Inventors: Jongwan Shim, Suwon-si (KR); Bumhee Bae, Suwon-si (KR); Younho Kim, Suwon-si (KR); Jeongnam Cheon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 270 days.

(21) Appl. No.: 18/406,734

(22) Filed: Jan. 8, 2024

(65) Prior Publication Data

US 2024/0147619 A1      May 2, 2024

Related U.S. Application Data

(63) Continuation of application No. PCT/KR2022/009977, filed on Jul. 8, 2022.

(30) Foreign Application Priority Data

Jul. 8, 2021     (KR) ........................ 10-2021-0089904

(51) Int. Cl.
    H05K 1/11          (2006.01)
    H05K 3/3465        (2026.01)
(52) U.S. Cl.
    CPC ........... H05K 1/111 (2013.01); H05K 3/3465 (2026.01); *H05K 2201/0154* (2013.01);
    (Continued)

(58) Field of Classification Search
    None
    See application file for complete search history.

(56) References Cited

U.S. PATENT DOCUMENTS 3,303,393 A  *  2/1967  Hymes ..................... H01B 1/02
                                                    174/253
5,329,423 A  *  7/1994  Scholz ................... H05K 3/325
                                                    361/767
(Continued)

FOREIGN PATENT DOCUMENTS

CN        109585390 A        4/2019
CN        112930589 A        6/2021
          (Continued)

OTHER PUBLICATIONS

International Search Report dated Oct. 17, 2022, issued in International Application No. PCT/KR2022/009977.
(Continued)

*Primary Examiner* — Krystal Robinson
(74) *Attorney, Agent, or Firm* — Jefferson IP Law, LLP

(57)                ABSTRACT

A substrate structure is provided. The substrate structure includes a first substrate, a plurality of first elastomer pins arranged on the first substrate, an elastic body disposed on the first substrate to surround the plurality of first elastomer pins, the elastic body including a plurality of spaces for receiving a plurality of solder balls on a second substrate connected to the first substrate, and a plurality of solder ball holders arranged on a boundary area of an opening of each of the plurality of spaces, wherein each of the plurality of solder ball holders has strength higher than that of the elastic body, and wherein each of the plurality of solder ball holders includes a plurality of pieces.

20 Claims, 13 Drawing Sheets

(52) U.S. Cl.
CPC ................ *H05K 2201/0314* (2013.01); *H05K 2201/10318* (2013.01); *H05K 2201/10659* (2013.01); *H05K 2203/041* (2013.01)

(56) References Cited

U.S. PATENT DOCUMENTS

| | | | | |
|---|---|---|---|---|
| 5,418,471 | A * | 5/1995 | Kardos | ................ G01R 1/0416 324/762.02 |
| 5,637,832 | A * | 6/1997 | Danner | ................ H05K 3/3452 361/767 |
| 6,070,785 | A * | 6/2000 | Ameen | ................ H05K 3/4015 228/180.1 |
| 6,377,475 | B1 * | 4/2002 | Reis | .................... H05K 9/0035 174/394 |
| 6,380,492 | B1 | 4/2002 | Yoshioka | |
| 7,612,450 | B2 * | 11/2009 | Lee | ........................ H01L 23/16 257/E23.021 |
| 9,012,789 | B1 * | 4/2015 | Yoshida | .............. H01L 23/3128 174/261 |
| 11,670,612 | B2 * | 6/2023 | Wirz | ........................ H01L 24/14 257/737 |
| 2004/0080049 | A1 | 4/2004 | Kim | |
| 2005/0208787 | A1 | 9/2005 | Dittmann | |
| 2006/0084288 | A1 | 4/2006 | Chuang et al. | |
| 2008/0302622 | A1 | 12/2008 | Ohtake et al. | |
| 2009/0061656 | A1 | 3/2009 | Tanaka et al. | |
| 2009/0102048 | A1 | 4/2009 | Hori | |
| 2011/0088929 | A1 | 4/2011 | Yang | |
| 2013/0330942 | A1 | 12/2013 | Rathburn | |
| 2014/0206234 | A1 | 7/2014 | Mason et al. | |
| 2017/0179056 | A1 | 6/2017 | Schrems et al. | |
| 2018/0277449 | A1 * | 9/2018 | Muto | ................... G01R 1/0483 |
| 2019/0103364 | A1 | 4/2019 | Kim | |
| 2019/0137541 | A1 | 5/2019 | Kim | |
| 2022/0238351 | A1 | 7/2022 | Zeng et al. | |

FOREIGN PATENT DOCUMENTS

| | | |
|---|---|---|
| JP | H04-142765 A | 5/1992 |
| JP | 2008-028072 A | 2/2008 |
| JP | 2008-267415 A | 11/2008 |
| JP | 2009-105209 A | 5/2009 |
| KR | 10-2001-0050991 A | 6/2001 |
| KR | 10-2003-0016773 A | 3/2003 |
| KR | 10-0722634 B1 | 5/2007 |
| KR | 10-2008-0007546 A | 1/2008 |
| KR | 10-1041219 B1 | 6/2011 |
| KR | 10-2018-0091273 A | 8/2018 |

OTHER PUBLICATIONS

Korean Office Action dated May 20, 2025, issued in Korean Patent Application No. 10-2021-0089904.

Korean Decision on Grant dated Jan. 15, 2026, issued in Korean Patent Application No. 10-2021-0089904.

Chinese Office Action dated May 6, 2026, issued in Chinese Application No. 202280048343.8.

\* cited by examiner

230

130

131

130

120

130

132

120

132-2 132-1

(a)                 (b)                 (c)

232  234

233

232  234

(a)

(b)

SUBSTRATE STRUCTURE CONNECTED ON BASIS OF SOLDER BALL AND ELASTIC BODY

CROSS-REFERENCE TO RELATED APPLICATION(S)

This application is a continuation application, claiming priority under § 365(c), of an International application No. PCT/KR2022/009977, filed on Jul. 8, 2022, which is based on and claims the benefit of a Korean patent application number 10-2021-0089904, filed on Jul. 8, 2021, in the Korean Intellectual Property Office, the disclosure of which is incorporated by reference herein in its entirety.

BACKGROUND

1. Field

The disclosure relates to a substrate structure connected based on solder balls.

2. Description of Related Art

As technology develops, the number of electronic devices (e.g., terminal devices, base station devices) that transmit and receive high-speed signals is increasing.

As such, components of electronic devices for transmitting and receiving signals require a board-to-board (B2B) structure for signal transmission.

The B2B structure requires two connector structures, such as of a male type and a female type, and includes a mechanism structure that may provide a certain amount of tension for signal transmission between the two connectors.

The above information is presented as background information only to assist with an understanding of the disclosure. No determination has been made, and no assertion is made, as to whether any of the above might be applicable as prior art with regard to the disclosure.

SUMMARY

In a B2B structure using elastomer pins, electrical connection is made by applying pressure to the elastomer pins by two substrates, and a space is placed in the elastic body surrounding the elastomer pin, and a mechanical fastening structure may be included in which a space is disposed in the elastic body surrounding the elastomer pins, and the solder balls are fastened to the space of the elastic body. For example, since the diameter of the mounting area of the solder ball mounted on one substrate is smaller than the diameter of the solder ball, the solder ball fastened to the space of the elastic body may be prevented from falling off by the elastic body surrounding the mounting area of the solder ball, in particular, the mounting area of the solder ball.

In this case, the solder ball is mounted on one substrate by soldering. If a lot of lead climbs up on the solder ball during soldering, the diameter of the mounting area of the solder ball increases, reducing the difference in diameter from the solder ball, with the result of weakened fastening.

Aspects of the disclosure are to address at least the above-mentioned problems and/or disadvantages and to provide at least the advantages described below. Accordingly, an aspect of the disclosure is to provide a substrate structure that has an enhanced mechanical fastening strength between the elastic body and the solder ball.

Additional aspects will be set forth in part in the description which follows and, in part, will be apparent from the description, or may be learned by practice of the presented embodiments.

In accordance with an aspect of the disclosure, a substrate structure is provided. The substrate structure includes a first substrate, a plurality of first elastomer pins disposed on the first substrate, an elastic body disposed on the first substrate to surround the plurality of first elastomer pins, the elastic body including a plurality of spaces for receiving a plurality of solder balls on a second substrate connected to the first substrate, and a plurality of solder ball holders disposed in boundary areas of respective openings of the plurality of spaces, wherein each of the plurality of solder ball holders has a higher strength than the elastic body, and wherein each of the plurality of solder ball holders include a plurality of pieces.

In accordance with another aspect of the disclosure, a substrate structure is provided. The substrate structure includes a second substrate to be connected to a plurality of first elastomer pins disposed on the first substrate, a plurality of solder balls mounted on the second substrate, and an anti-solder wicking structure disposed between the second substrate and the plurality of solder balls.

According to various embodiments of the disclosure, it is possible to prevent the solder ball and elastic body from falling off and thus increase the fastening strength between the two substrates.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1A:
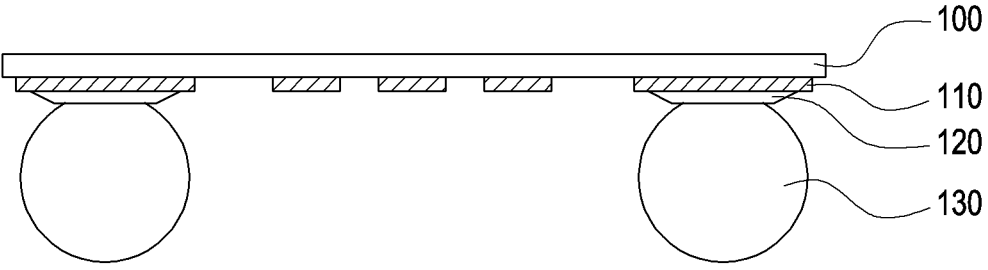
FIG. 1A is a view illustrating a substrate including solder balls according to an embodiment of the disclosure.

FIG. 1A is a view illustrating a substrate including solder balls according to an embodiment of the disclosure.

According to various embodiments, referring to FIG. 1A, the substrate structure may include a substrate 100, a plurality of PADs 110 disposed on the substrate 100, a plurality of solder balls 130, and a plurality of pieces of lead 120 disposed between the plurality of PADs 110 and the plurality of solder balls 130.

According to various embodiments, the substrate may include a printed circuit board (PCB) or a flexible printed circuit board (FPCB). According to various embodiments, the substrate may have a circuit (e.g., an electronic wiring) patterned so that components may operate.

According to various embodiments, the plurality of PADs 110 may be portions where wires for connecting the internal circuit of the substrate 100 and the external circuit are to be bonded. For example, a metal-deposited film such as aluminum may be disposed.

According to various embodiments, the plurality of solder balls 130 may be spherical lead pieces and be connected to the plurality of PADs 110 through soldering. According to various embodiments, the plurality of solder balls 130 may be used for connection with another substrate and may transfer an electrical signal. According to various embodiments, the height of the substrate structure may be adjusted through the sizes of the plurality of solder balls 130, and the product may be downsized by using a minimum space as injection molding or a metal structure is not used.

According to various embodiments, the substrate structure may further include an anti-solder wicking structure for securing reliability in connection with another substrate. For example, the anti-solder wicking structure may further include plating performed on the plurality of solder balls 130 or an anti-solder wicking film disposed between the plurality of pieces of lead 120 and the plurality of solder balls 130.

According to various embodiments, plating performed on the plurality of solder balls 130 is described below with reference to FIG. 2, and anti-solder wicking films disposed between the plurality of pieces of lead 120 and the plurality of solder balls 130 are described below with reference to FIGS. 3 and 4A to 4C.

According to various embodiments, the anti-solder wicking structure may prevent a reduction in the fastening strength with the elastic body (e.g., the elastic body 230 of FIG. 1B) on another substrate as the plurality of pieces of lead 120 climb up on the plurality of solder balls 130 when the plurality of solder balls 130 are connected to the plurality of PADs 110 through soldering.

Figure 1B:
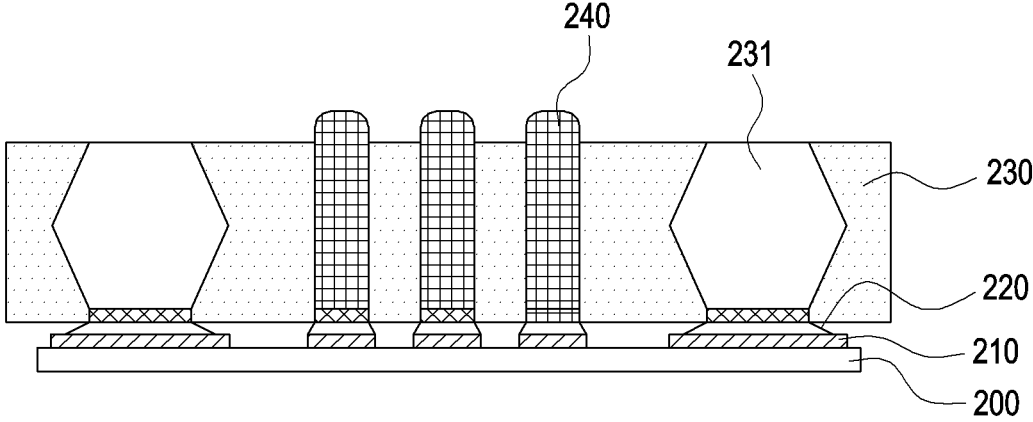
FIG. 1B is a view illustrating an elastic body for receiving solder balls according to an embodiment of the disclosure.

FIG. 1B is a view illustrating an elastic body for receiving solder balls according to an embodiment of the disclosure.

According to various embodiments, referring to FIG. 1B, the substrate structure may include a substrate 200, a plurality of PADs 210 disposed on the substrate 200, a plurality of pieces of lead 220 disposed on some of the plurality of PADs 210, a plurality of elastomer pins 240 disposed on some of the plurality of PADs 210, and an elastic body 230 surrounding the plurality of elastomer pins 240 and including a plurality of spaces 231 in which a plurality of solder balls (e.g., the plurality of solder balls 130 of FIG. 1A) are to be received. For example, the elastic body 230 may be silicon (Si).

According to various embodiments, the plurality of spaces 231 included in the elastic body 230 respectively may correspond to positions of the plurality of solder balls (e.g., the plurality of solder balls 130 of FIG. 1A) on the substrate (e.g., the substrate 100 of FIG. 1A).

According to various embodiments, the plurality of spaces 231 included in the elastic body 230 may be disposed to be shielded when coupled to the plurality of solder balls (e.g., the plurality of solder balls 130 of FIG. 1A). For example, the plurality of spaces 231 may be disposed so that the plurality of solder balls are coupled at regular intervals to form a shielding structure, excluding the positions where the signal lines are to be wired.

According to various embodiments, as the plurality of spaces 231 of the elastic body 230 which is a mechanical fastening structure and the elastomer pins which are electric connecting structures are simultaneously manufactured, tolerance between components may be minimized.

According to various embodiments, the substrate structure may further include a structure for securing reliability in connection with another substrate. For example, the substrate structure may further include a plurality of solder ball holders disposed in the plurality of spaces 231. For example, the plurality of solder ball holders may be disposed in boundary areas of the respective openings of the plurality of spaces 231, and may have a larger strength than the elastic body 230.

According to various embodiments, the plurality of solder ball holders may prevent the plurality of solder balls from falling out of the plurality of spaces after the plurality of solder balls are received in the plurality of spaces, thereby enhancing the fastening strength between the plurality of solder balls and the elastic body.

A plurality of solder ball holders according to various embodiments are described below with reference to FIGS. 5A to 5D, 6 to 8, 9A to 9D, 10, and 11.

According to various embodiments, the plurality of solder balls 130 may include fastening portions fastened to the plurality of solder ball holders to ensure reliability in connection with another substrate. The shape of the plurality of solder ball holders according to various embodiments is described below with reference to FIG. 11.

Figure 1C:
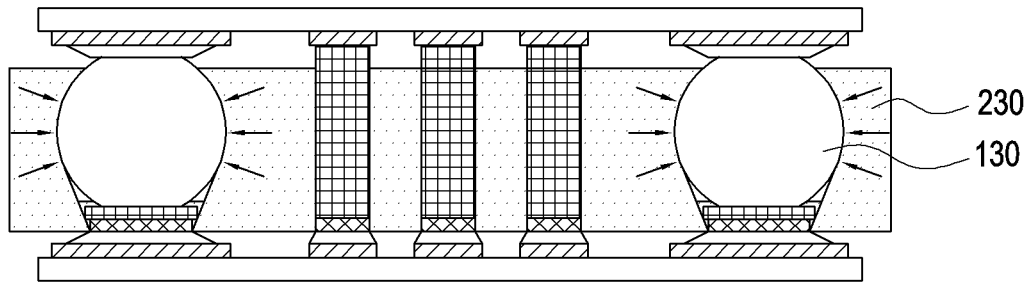
FIG. 1C is a view illustrating a substrate structure in which the substrate of FIG. 1A and the substrate of FIG. 1B are connected according to an embodiment of the disclosure.

FIG. 1C is a view illustrating a substrate structure in which the substrate of FIG. 1A and the substrate of FIG. 1B are connected according to an embodiment of the disclosure.

According to various embodiments, referring to FIG. 1C, the plurality of solder balls 130 included in the substrate 100 illustrated in FIG. 1A may enter the plurality of spaces, respectively, included in the elastic body 230 included in the substrate 200 illustrated in FIG. 1B, and the substrate 100 illustrated in FIG. 1A and the substrate 200 illustrated in FIG. 1B may be fastened due to the pressure of the elastic body 230 on the plurality of solder balls 130.

According to various embodiments, in order to enhance the fastening strength between the substrate 100 illustrated in FIG. 1A and the substrate 200 illustrated in FIG. 1B, a plurality of solder balls 130 may be plated, an anti-solder wicking film may be added, or solder ball holders may be added in the substrate structure.

According to various embodiments, an electrical connection may be performed between the substrate 100 illustrated in FIG. 1A and the substrate 200 illustrated in FIG. 1B through the solder balls 130. According to various embodiments, the substrate structure may further include an elastomer pin to enhance electrical connection between the substrate 100 on which the solder ball 130 is disposed and the substrate 200 on which the elastic body 230 is disposed. For example, the substrate structure may further include elastomer pins in areas corresponding to a plurality of spaces of the substrate illustrated in FIG. 1B, or may further include elastomer pins disposed on the elastic body as side surfaces of the plurality of spaces. A substrate structure further including elastomer pins according to various embodiments is described below with reference to FIGS. 8 and 9A to 9D.

Figure 2:
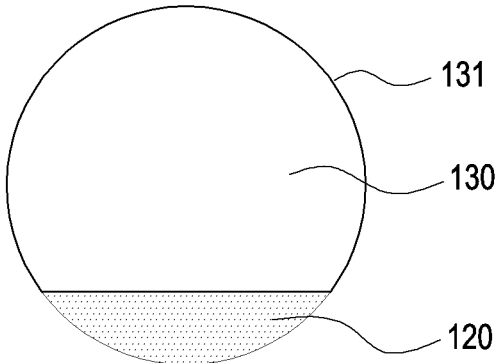
FIG. 2 is a view illustrating solder ball plating for preventing solder wicking according to an embodiment of the disclosure.

FIG. 2 is a view illustrating solder ball plating for preventing solder wicking according to an embodiment of the disclosure.

According to various embodiments, referring to FIG. 2, when the solder ball 130 is plated with nickel 131 and the solder ball 130 plated with nickel 131 is connected to the substrate by soldering, lead 120 may not climb up on the nickel 131-plated area of the surface of the solder ball 130.

According to various embodiments, the solder balls 130 plated with nickel 131 may be individually mounted on the substrate, or the plurality of solder balls 130 may be mounted on the substrate while being disposed at positions to be mounted on the film.

Figure 3:
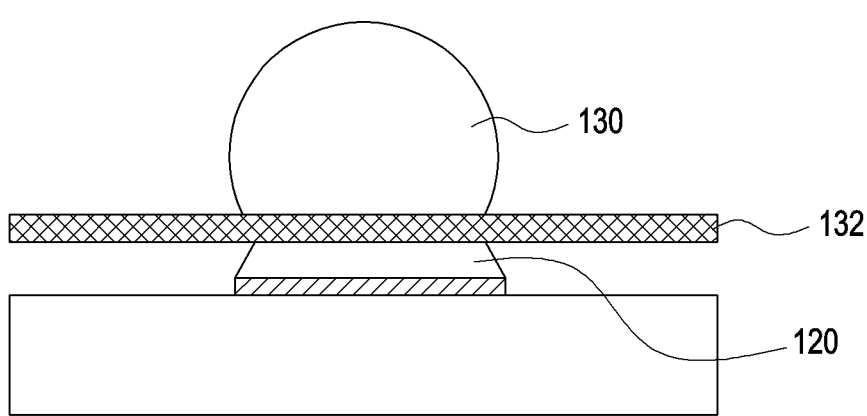
FIG. 3 is a view illustrating an anti-solder wicking film for preventing solder wicking according to an embodiment of the disclosure.

FIG. 3 is a view illustrating an anti-solder wicking film for preventing solder wicking according to an embodiment of the disclosure.

According to various embodiments, referring to FIG. 3, a solder ball 130 may be mounted on a substrate (e.g., the substrate 100 of FIG. 1A). According to various embodiments, an anti-solder wicking film 132 may be disposed in the middle of the solder ball 130 mounted on the substrate.

For example, the solder ball 130 may be mounted on the substrate through soldering, and the anti-solder wicking film 132 may be further disposed between the mounted solder ball 130 and the lead 120.

According to various embodiments, the anti-solder wicking film 132 may include a polyethylene terephthalate (PET) film or a polyimide film.

According to various embodiments, the anti-solder wicking film 132 may or may not be removed after the solder ball 130 is mounted on the substrate.

Figure 4A:
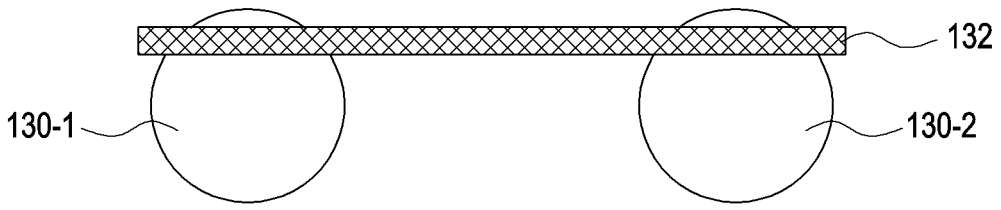
FIG. 4A is a view illustrating an anti-solder wicking film for preventing solder wicking according to an embodiment of the disclosure.

FIG. 4A is a view illustrating an anti-solder wicking film for preventing solder wicking according to an embodiment of the disclosure.

According to various embodiments, referring to FIG. 4A, the anti-solder wicking film 132 may be manufactured in a state in which the plurality of solder balls 130-1 and 130-2 are attached.

According to various embodiments, the plurality of solder balls 130-1 and 130-2 may be mounted on the substrate while being attached at positions of the anti-solder wicking film 132 corresponding to the positions to be mounted. For example, the anti-solder wicking film 132 where the plurality of solder balls 130-1 and 130-2 are attached may be used as one component.

Figure 4B:
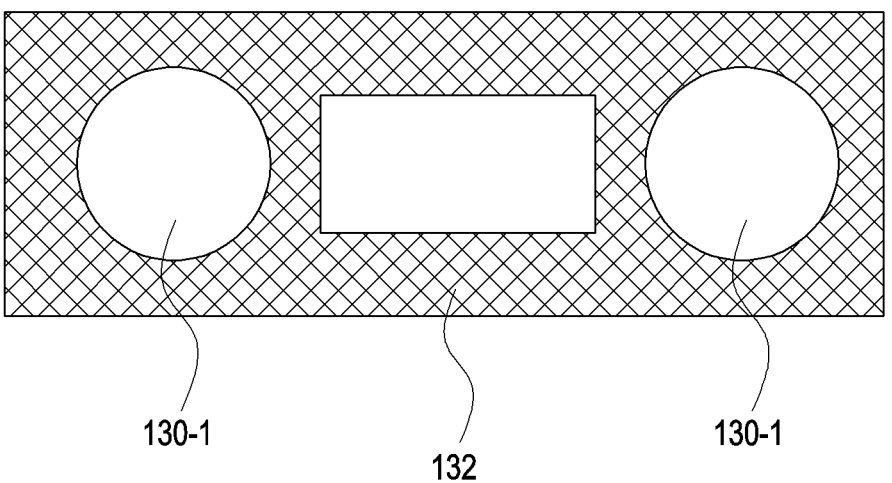
FIG. 4B is a view illustrating an anti-solder wicking film for preventing solder wicking according to an embodiment of the disclosure.

FIG. 4B is a view illustrating an anti-solder wicking film for preventing solder wicking according to an embodiment of the disclosure.

According to various embodiments, referring to FIG. 4B, the anti-solder wicking film 132 may include a plurality of solder balls 130-1 and 130-2 attached at positions corresponding to positions of a plurality of spaces (e.g., the plurality of spaces 231 of FIG. 1B) included in an elastic body (e.g., the elastic body 230 in FIG. 1B) disposed on a substrate (e.g., the substrate 200 in FIG. 1B) to be connected.

According to various embodiments, the anti-solder wicking film may be in a state in which the area corresponding to the positions of the plurality of elastomer pins disposed on the substrate (e.g., the substrate 200 of FIG. 1B) to be connected has been removed.

According to various embodiments, if the anti-solder wicking film 132 is removed after being mounted on the substrate (e.g., the substrate 100 of FIG. 1A), the anti-solder wicking film 132 may be in a state in which the area corresponding to the positions of the plurality of elastomer pins disposed on the substrate (e.g., the substrate 200 of FIG. 1B) to be connected has not been removed.

Figure 4C:
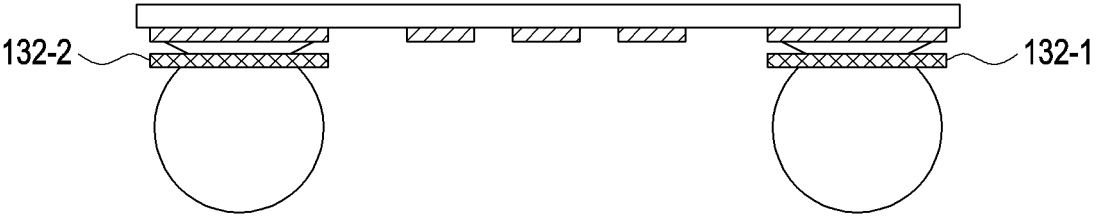
FIG. 4C is a view illustrating an anti-solder wicking film for preventing solder wicking according to an embodiment of the disclosure.

FIG. 4C is a view illustrating an anti-solder wicking film for preventing solder wicking according to an embodiment of the disclosure.

For example, FIG. 4C illustrates a state in which the plurality of solder balls 130-1 and 130-2 are mounted on a substrate (e.g., the substrate 100 of FIG. 1A) in a state in which the plurality of solder balls 130-1 and 130-2 are attached to the anti-solder wicking film 132, and the anti-solder wicking film 132 is removed after the plurality of solder balls 130-1 and 130-2 are mounted on the substrate (e.g., the substrate 100 of FIG. 1A). For example, the anti-solder wicking film 132 in an area other than the mounting area of the plurality of solder balls 130-1 and 130-2 may be physically removed.

According to various embodiments, referring to FIG. 4C, based on the operation of removing the anti-solder wicking film, the anti-solder wicking film 132-1 and 132-2 may be disposed only in the area in which the plurality of solder balls are mounted.

According to various embodiments, the plurality of solder balls may be mounted at positions on the substrate (e.g., the substrate 100 of FIG. 1A) corresponding to positions of the plurality of spaces (e.g., the plurality of spaces 231 of FIG. 1B) included in the elastic body (e.g., the elastic body 230 of FIG. 1B) disposed on the substrate (e.g., the substrate 200 of FIG. 1B).

According to various embodiments, the plurality of solder balls may be disposed to be shielded when coupled to the plurality of spaces (e.g., the plurality of spaces 231 in FIG. 1B).

Figure 5A:
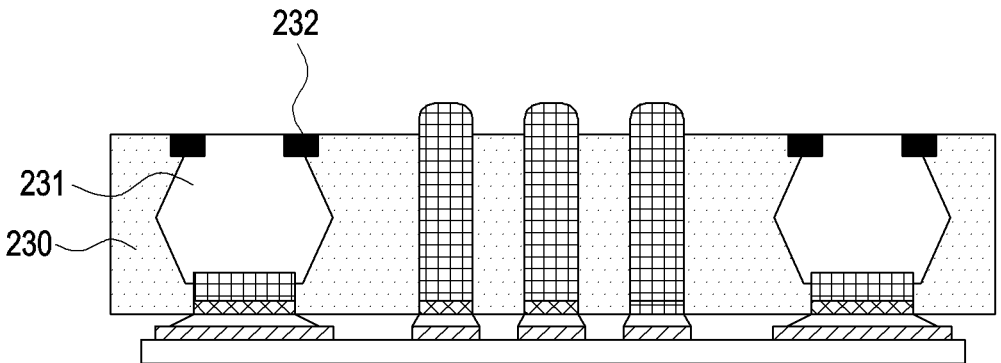
FIG. 5A is a view illustrating a solder ball holder according to an embodiment of the disclosure.

FIG. 5A is a view illustrating a solder ball holder according to an embodiment of the disclosure.

According to various embodiments, referring to FIG. 5A, a substrate structure may include a substrate (e.g., the substrate 200 of FIG. 1B) and a plurality of elastomer pins (e.g., the plurality of elastomer pins 240 of FIG. 1B) disposed on the substrate (e.g., the substrate 200 of FIG. 1B).

According to various embodiments, the substrate structure may include an elastic body 230 disposed on the substrate to surround the plurality of elastomer pins.

According to various embodiments, the elastic body 230 may include a plurality of spaces 231 for receiving a plurality of solder balls disposed on another substrate connected.

According to various embodiments, the substrate structure may include a plurality of solder ball holders 232 disposed in boundary areas of the respective openings of the plurality of spaces.

According to various embodiments, each of the plurality of solder ball holders 232 may have a higher strength than the elastic body 230 and may include a plurality of pieces.

Figure 7:
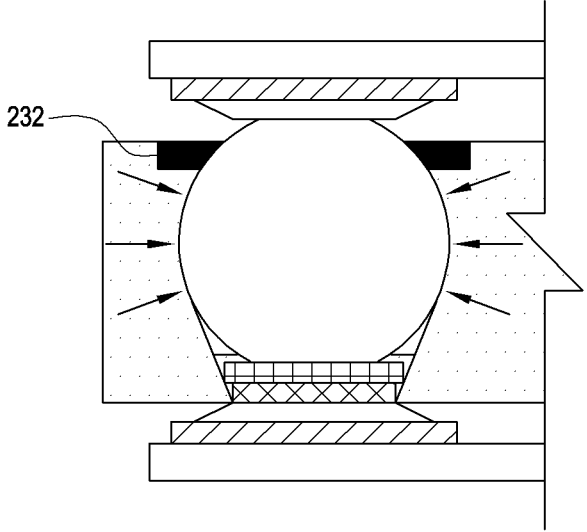
FIG. 7 is a view illustrating a form of a solder ball holder according to an embodiment of the disclosure.

According to various embodiments, cross sections of the plurality of solder ball holders 232 may be rectangular as illustrated in FIG. 5A or trapezoidal as illustrated in FIG. 7.

Figure 5B:
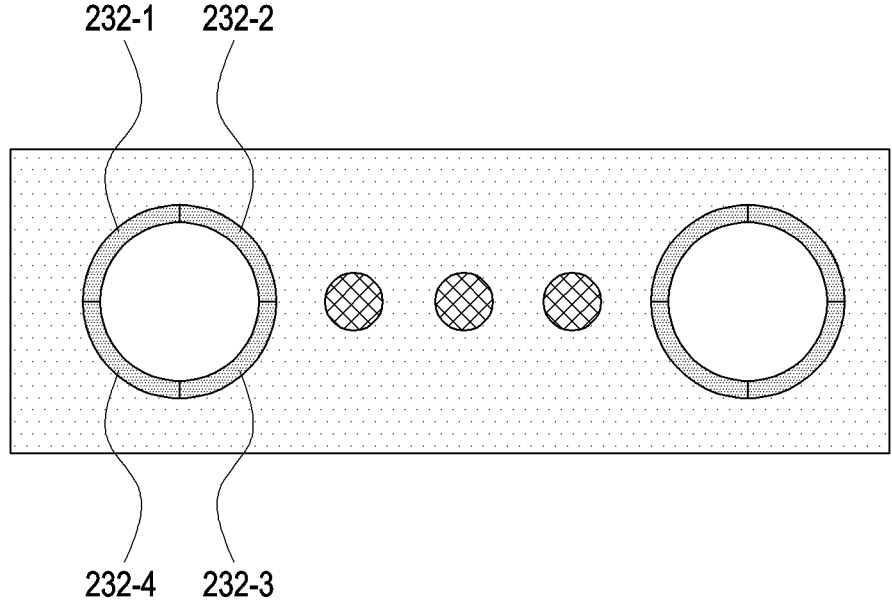
FIG. 5B is a view illustrating a solder ball holder according to an embodiment of the disclosure.

FIG. 5B is a view illustrating a solder ball holder according to an embodiment of the disclosure.

According to various embodiments, referring to FIG. 5B, each of the plurality of solder ball holders (e.g., the plurality of solder ball holders 232 of FIG. 5A) may have a closed curve shape corresponding to the shape of the boundary of the opening of each of the plurality of spaces (e.g., the plurality of spaces 231 of FIG. 5A). According to various embodiments, the plurality of solder ball holders may be disposed to be spaced apart from each other on the boundaries of the openings of the plurality of spaces. An embodiment in which a plurality of solder ball holders are disposed to be spaced apart from each other according to various embodiments is described below with reference to FIG. 6.

According to various embodiments, each of the plurality of solder ball holders (e.g., the plurality of solder ball holders 232 of FIG. 5A) may include a plurality of pieces 232-1, 232-2, 232-3, and 232-4. For example, the plurality of pieces 232-1 to 232-4 may have a closed curve shape corresponding to the shape of the boundary of the opening of each of the plurality of spaces (e.g., the plurality of spaces 231 of FIG. 5A).

Although FIG. 5B illustrates that the number of the plurality of pieces 232-1 to 232-4 is four for convenience of description, the number of the plurality of pieces may be two or more and four or less or may be five or more according to various embodiments.

Figure 5C:
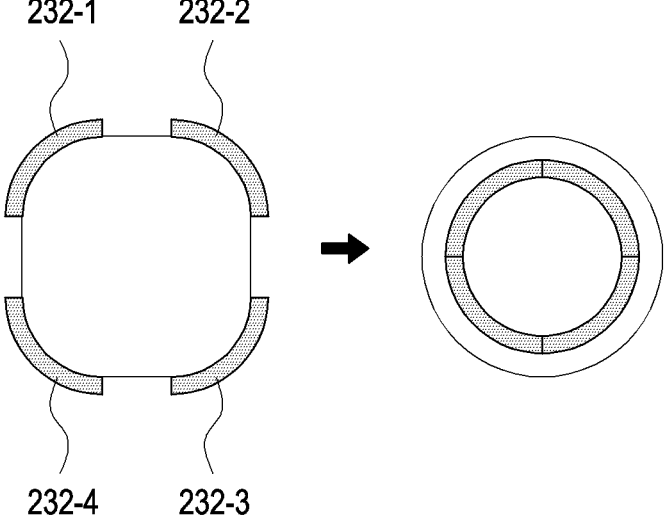
FIG. 5C is a view illustrating a solder ball holder according to an embodiment of the disclosure.

FIG. 5C is a view illustrating a solder ball holder according to an embodiment of the disclosure.

According to various embodiments, referring to FIG. 5C, the plurality of pieces 232-1 to 232-4 included in each of the plurality of solder ball holders (e.g., the plurality of solder ball holders 232 of FIG. 5A) may be attached to an elastic body (e.g., the elastic body 230 of FIG. 5A).

According to various embodiments, the gap between the plurality of pieces 232-1 to 232-4 included in each of the plurality of solder ball holders (e.g., the plurality of solder ball holders 232 in FIG. 5A) may increase while the plurality of solder balls (e.g., the plurality of solder balls 130 in FIG. 1A) respectively enter the plurality of spaces (e.g., the plurality of spaces 231 in FIG. 5A), and may return to the original gap when the entry is completed.

For example, while the plurality of solder balls (e.g., the plurality of solder balls 130 of FIG. 1A) having a diameter greater than the diameter of the boundary of the opening of each of the plurality of spaces (e.g., the plurality of spaces 231 of FIG. 5A) included in the elastic body (e.g., the elastic body 230 of FIG. 5A) enter the plurality of spaces (e.g., the plurality of spaces 231 of FIG. 5A), the diameter of the boundary of the opening of the elastic body increases, so that the gap between the plurality of pieces 232-1 to 232-4 may increase based on the diameter of the plurality of solder balls (e.g., the plurality of solder balls 130 of FIG. 1A).

According to various embodiments, if entry of the plurality of solder balls into the plurality of spaces (e.g., the plurality of spaces 231 in FIG. 5A) is completed, the diameter of the boundary of the opening of the elastic body increases, so that the gap between the plurality of pieces 232-1 to 232-4 returns to the original gap, and the plurality of solder balls and the elastic body may be coupled to each other.

Figure 5D:
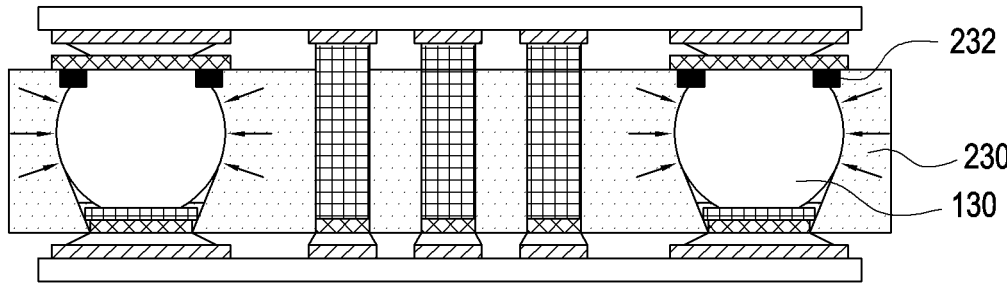
FIG. 5D is a view illustrating a substrate structure connected using a solder ball holder according to an embodiment of the disclosure.

FIG. 5D is a view illustrating a substrate structure connected using a solder ball holder according to an embodiment of the disclosure.

According to various embodiments, referring to FIG. 5D, the plurality of solder balls included in the substrate illustrated in FIG. 4C respectively may enter the plurality of spaces 231 included in the elastic body 230 included in the substrate illustrated in FIG. 5A, and the substrate illustrated in FIG. 4C (e.g., the substrate 100 illustrated in FIG. 1A) and the substrate illustrated in FIG. 5A (e.g., the substrate 200 illustrated in FIG. 1B) may be fastened due to the pressure of the elastic body 230 on the plurality of solder balls.

According to various embodiments, in order to enhance the fastening strength between the substrate illustrated in FIG. 4C and the substrate illustrated in FIG. 5A, the plurality of solder balls 130 may be plated (e.g., 131 of FIG. 2), an anti-solder wicking film (e.g., 132-1 and 132-2 of FIG. 4C) may be added, or solder ball holders 232 may be added in the substrate structure.

According to various embodiments, an electrical connection may be performed between the substrate illustrated in FIG. 4C and the substrate illustrated in FIG. 5A through solder balls. According to various embodiments, the substrate structure may further include an elastomer pin to enhance electrical connection between the substrate which on the solder ball is disposed and the substrate on which the elastic body 230 is disposed. For example, the substrate structure may further include elastomer pins in areas corresponding to a plurality of spaces 231 of the substrate illustrated in FIG. 5A, or may further include elastomer pins disposed on the elastic body 230 as side surfaces of the plurality of spaces 231. A substrate structure further including elastomer pins according to various embodiments is described below with reference to FIGS. 8 and 9A to 9D.

Figure 6:
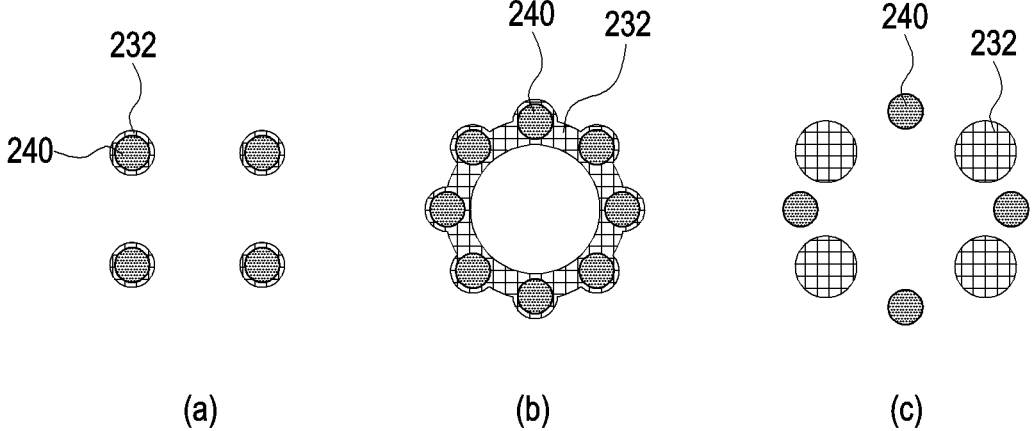
FIG. 6 is a view illustrating a solder ball holder according to an embodiment of the disclosure.

FIG. 6 is a view illustrating a solder ball holder according to an embodiment of the disclosure. For example, FIG. 6 is a view illustrating the respective openings of a plurality of spaces included in an elastic body as viewed thereabove.

According to various embodiments, referring to parts (a) to (c) of FIG. 6, the plurality of solder ball holders 232 may be disposed to be spaced apart from each other on the boundaries of the respective openings of the plurality of spaces included in the elastic body.

According to various embodiments, the plurality of solder ball holders 232 may be used independently or in combination with the elastomer pins 240.

For example, referring to part (a) of FIG. 6, a plurality of elastomer pins spaced apart from each other may be disposed on the side surfaces of the plurality of spaces included in the elastic body, and a plurality of solder ball holders 232 may be disposed on the plurality of elastomer pins, respectively.

According to various embodiments, referring to part (b) FIG. 6, elastomer pins may be disposed to surround the side surfaces of the plurality of spaces included in the elastic body, and the plurality of solder ball holders 232 may be disposed on the elastomer pins.

For example, referring to part (c) of FIG. 6, a plurality of elastomer pins spaced apart from each other may be disposed on the side surfaces of the plurality of spaces included in the elastic body, and each of the plurality of solder ball holders 232 may be disposed between the plurality of elastomer pins.

According to various embodiments, parts (a) to (c) of FIG. 6 illustrate that the plurality of solder ball holders 232 are circular, but according to various embodiments, the plurality of solder ball holders 232 may have a rectangular, triangular, or trapezoidal shape.

According to various embodiments, cross sections of the plurality of solder ball holders 232 may be rectangular as illustrated in FIG. 5A or trapezoidal as illustrated in FIG. 7.

FIG. 7 is a view illustrating a form of a solder ball holder according to an embodiment of the disclosure.

According to various embodiments, referring to FIG. 7, as the plurality of solder ball holders 232 have a trapezoidal shape, the fastening strength between the solder ball and the elastic body may be enhanced.

Figure 8:
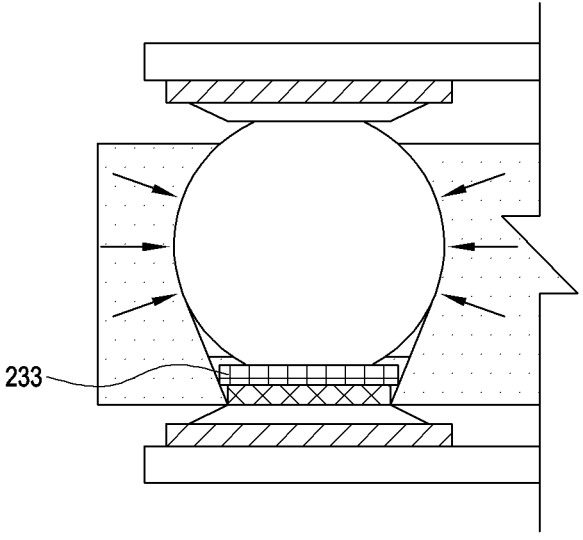
FIG. 8 is a view illustrating a substrate structure further including an elastomer pin according to an embodiment of the disclosure.

FIG. 8 is a view illustrating a substrate structure further including an elastomer pin according to an embodiment of the disclosure.

According to various embodiments, referring to FIG. 8, the plurality of solder balls included in the substrate illustrated in FIG. 4C respectively may enter the plurality of spaces included in the elastic body included in the substrate illustrated in FIG. 5A, and the substrate illustrated in FIG. 4C and the substrate illustrated in FIG. 5A may be fastened due to the pressure of the elastic body on the plurality of solder balls.

According to various embodiments, an electrical connection may be performed between the substrate illustrated in FIG. 4C and the substrate illustrated in FIG. 5A through solder balls. According to various embodiments, the substrate structure may further include an elastomer pin 233 to enhance electrical connection between the solder ball and the substrate on which the elastic body is disposed. For example, the substrate structure may further include elastomer pins 233 in areas corresponding to a plurality of spaces in the substrate shown in FIG. 5A.

As described above, the electrical connection effect may be enhanced by disposing the elastomer pin 233 between the solder ball and the substrate.

According to various embodiments, the elastomer pins may be disposed on the side surfaces of the plurality of spaces of the elastic body. An embodiment in which elastomer pins are disposed on side surfaces of a plurality of spaces according to various embodiments is described below with reference to FIGS. 9A to 9D.

According to various embodiments, although FIG. 8 illustrates that only the elastomer pin 233 is further disposed in the substrate structure, a plurality of solder balls may be plated with nickel, an anti-solder wicking film (e.g., 132-1 and 132-2 in FIG. 4C) may be added, or a solder ball holder (e.g., the solder ball holder 232 in FIG. 5A) may be added.

Figure 9A:
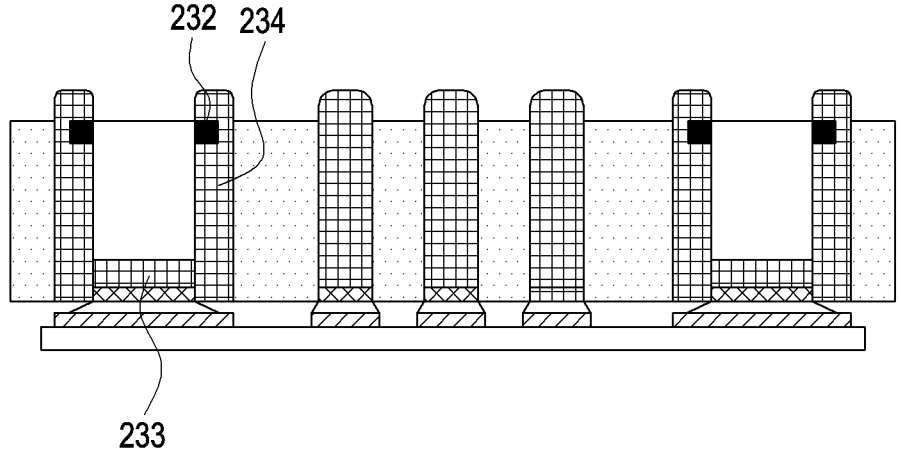
FIG. 9A is a view illustrating a substrate structure further including an elastomer pin according to an embodiment of the disclosure.

FIG. 9A is a view illustrating a substrate structure further including an elastomer pin according to an embodiment of the disclosure. For example, FIG. 9A is a cross-sectional view of a substrate structure including a substrate including an elastic body before being coupled to another substrate where solder balls are mounted.

According to various embodiments, referring to FIG. 9A, a substrate structure may include a substrate (e.g., the substrate 200 of FIG. 1B) and a plurality of elastomer pins (e.g., the plurality of elastomer pins of FIG. 1B) disposed on the substrate (e.g., the substrate 200 of FIG. 1B).

According to various embodiments, the substrate structure may include an elastic body (e.g., the elastic body 230 of FIG. 5A) disposed on the substrate to surround the plurality of elastomer pins.

According to various embodiments, the elastic body (e.g., the elastic body 230 of FIG. 5A) may include a plurality of spaces (e.g., the plurality of spaces 231 of FIG. 5A) for receiving a plurality of solder balls disposed on another substrate connected.

According to various embodiments, the substrate structure may include a plurality of solder ball holders (e.g., the plurality of solder ball holders 232 of FIG. 5A) disposed in boundary areas of the respective openings of the plurality of spaces.

According to various embodiments, each of the plurality of solder ball holders 232 may have a higher strength than the elastic body and may include a plurality of pieces. For example, the plurality of solder ball holders 232 may be formed of polyimide.

According to various embodiments, cross sections of the plurality of solder ball holders 232 may be rectangular or may be trapezoidal as illustrated in FIG. 7.

According to various embodiments, the substrate structure may further include elastomer pins 233 and 234 to enhance electrical connection between the solder ball and the substrate on which the elastic body is disposed.

For example, as illustrated in FIG. 5A, the substrate structure may further include elastomer pins 233 disposed on the substrate in a plurality of spaces.

According to various embodiments, the substrate structure may further include elastomer pins 234 disposed on side surfaces of the plurality of spaces.

Figure 9B:
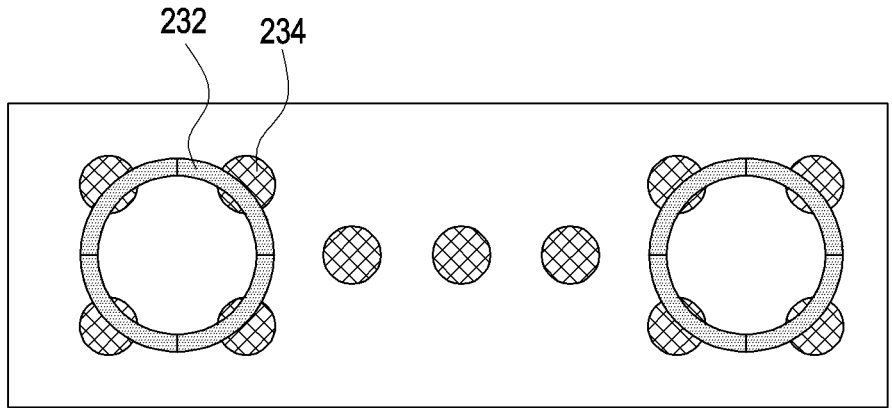
FIG. 9B is a view illustrating a substrate structure further including an elastomer pin according to an embodiment of the disclosure.

FIG. 9B is a view illustrating a substrate structure further including an elastomer pin according to an embodiment of the disclosure. FIG. 9B is a plan view of a substrate structure including a substrate including an elastic body before being coupled to another substrate where solder balls are mounted.

According to various embodiments, referring to FIG. 9B, the plurality of elastomer pins 234 may be disposed to be spaced apart from each other on the side surfaces of the plurality of spaces included in the elastic body.

According to various embodiments, the solder ball holder 232 including the plurality of pieces may have a closed curve shape corresponding to the shape of the boundary of the opening of each of the plurality of spaces included in the elastic body. According to various embodiments, the solder ball holders 232 including the plurality of pieces may be disposed to be spaced apart from each other at the boundaries of the respective openings of the plurality of spaces included in the elastic body, which is described below with reference to FIG. 9C.

Figure 9C:
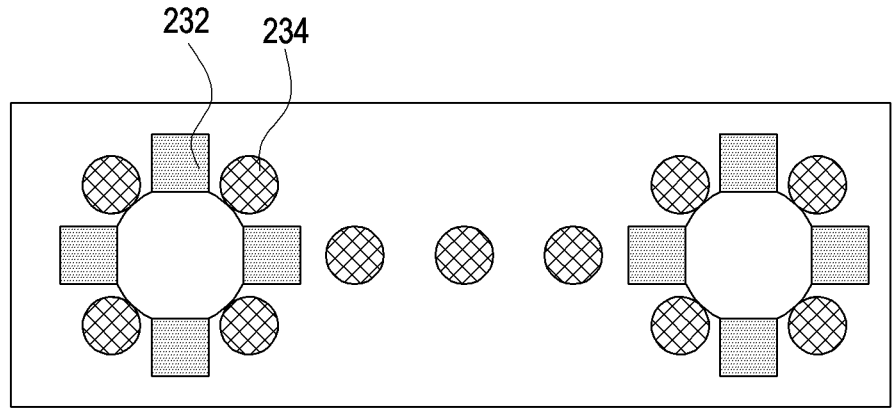
FIG. 9C is a view illustrating a substrate structure further including an elastomer pin according to an embodiment of the disclosure.

FIG. 9C is a view illustrating a substrate structure further including an elastomer pin according to an embodiment of the disclosure. FIG. 9C is a plan view of a substrate structure including a substrate including an elastic body before being coupled to another substrate where solder balls are mounted.

According to various embodiments, referring to FIG. 9C, the plurality of elastomer pins 234 may be disposed to be spaced apart from each other on the side surfaces of the plurality of spaces included in the elastic body.

According to various embodiments, the solder ball holders 232 including the plurality of pieces may be disposed to be spaced apart from each other at the boundaries of the respective openings of the plurality of spaces included in the elastic body.

According to various embodiments, the plurality of solder ball holders 232 may be disposed between the plurality of elastomer pins 234. According to various embodiments, the solder ball holders 232 may be disposed on the plurality of elastomer pins 234 as illustrated in FIG. 6.

Figure 9D:
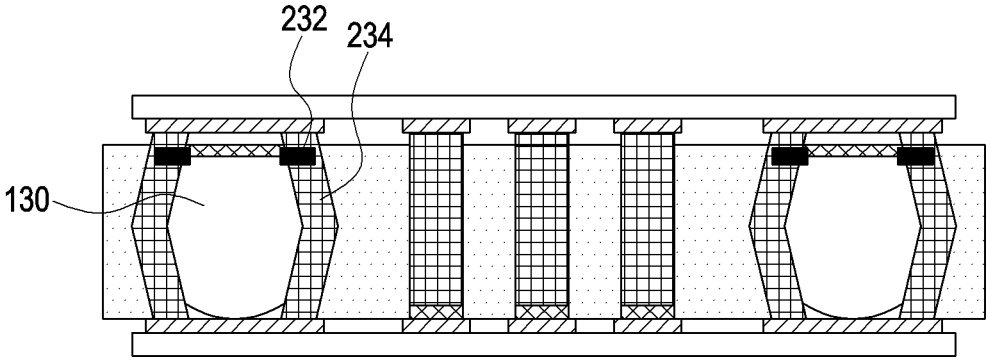
FIG. 9D is a view illustrating a substrate structure further including an elastomer pin according to an embodiment of the disclosure.

FIG. 9D is a view illustrating a substrate structure further including an elastomer pin according to an embodiment of the disclosure. FIG. 9D is a cross-sectional view of a substrate structure after being coupled to another substrate on which solder balls are mounted.

According to various embodiments, referring to FIG. 9D, the substrate structure may be in a state in which the substrate illustrated in FIG. 9A and the substrate on which the solder balls 130 are mounted are coupled.

According to various embodiments, in the substrate structure, the bonding strength between the solder balls 130 and the elastic body may be enhanced by the solder ball holders 232, and the electrical connection effect may be enhanced by the elastomer pins 234.

Figure 10:
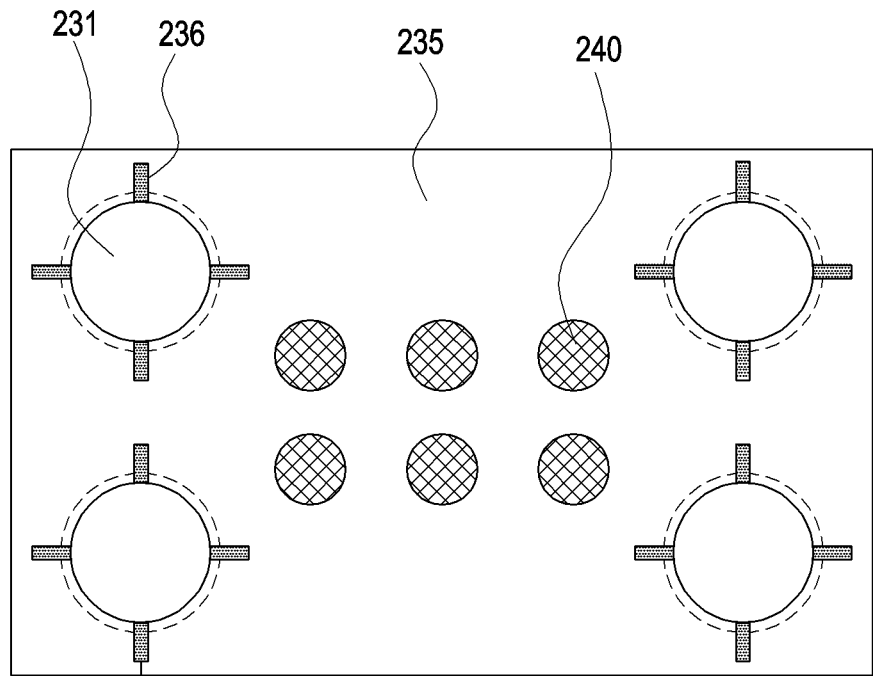
FIG. 10 is a view illustrating an opening form of solder ball holder included in a film form, according to an embodiment of the disclosure.

FIG. 10 is a view illustrating an opening form of solder ball holder included in a film form, according to an embodiment of the disclosure. For example, FIG. 10 is a plan view of a substrate structure including a substrate including an elastic body before being coupled to another substrate where solder balls are mounted.

According to various embodiments, referring to FIG. 10, the solder ball holders, respectively, may be in the form of a plurality of openings in the film 235 attached to the elastic body. According to various embodiments, the elastomer pins 240 to be connected to another substrate may pass through the film 235.

According to various embodiments, the plurality of openings of the film 235 may correspond to the respective openings of the plurality of spaces 231 included in the elastic body.

According to various embodiments, each of the plurality of openings of the film 235 may include a plurality of slits 236.

According to various embodiments, while the plurality of solder balls enter the plurality of spaces 231 of the elastic body through the plurality of openings of the film 235, the plurality of slits 236 may be opened. According to various embodiments, if entry of the plurality of solder balls into the plurality of spaces 231 of the elastic body is completed, the plurality of slits 236 that have been opened may return to their original state, thereby enhancing the fastening strength between the plurality of solder balls and the elastic body.

Figure 11:
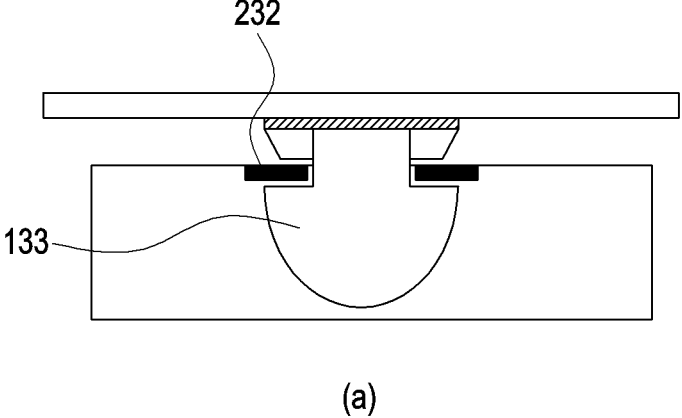
FIG. 11 is a view illustrating a form of a solder ball according to an embodiment of the disclosure.
Figure 11:
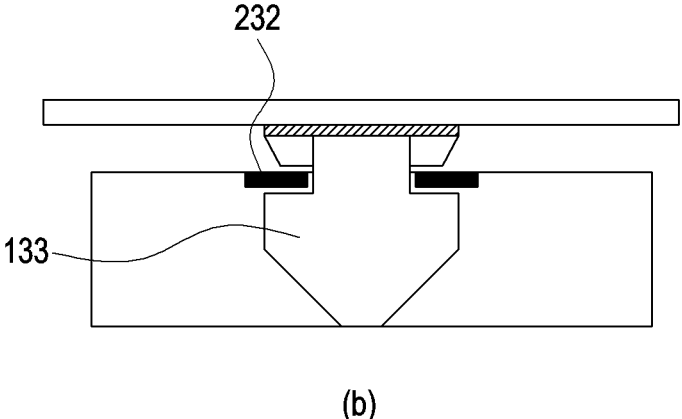

FIG. 11 is a view illustrating a form of a solder ball according to an embodiment of the disclosure.

According to various embodiments, referring to parts (a) and (b) of FIG. 11, each of the plurality of solder balls may further include a fastening portion 133 fastened to the solder ball holder 232 attached to the elastic body when entering the plurality of spaces included in the elastic body.

For example, the fastening portion 133 may include a groove disposed at the boundary where the solder ball is mounted and a flat surface contacting the solder ball holder 232.

This may enhance the fastening strength with the solder ball holder and reduce the risk of the solder ball falling out of the elastic body as compared to when the solder ball is spherical.

According to various embodiments, a substrate structure may comprise a first substrate, a plurality of first elastomer pins disposed on the first substrate, an elastic body disposed on the first substrate to surround the plurality of first elastomer pins and including a plurality of spaces for receiving a plurality of solder balls on a second substrate connected to the first substrate, and a plurality of solder ball holders disposed in boundary areas of respective openings of the plurality of spaces. Each of the plurality of solder ball holders may have a higher strength than the elastic body and include a plurality of pieces.

According to various embodiments, each of the plurality of solder ball holders may have a closed curve shape corresponding to a shape of a boundary of an opening of each of the plurality of spaces.

According to various embodiments, the plurality of solder ball holders may be disposed to be spaced apart on the boundaries of the respective openings of the plurality of spaces.

According to various embodiments, the plurality of solder ball holders respectively may be shaped as a plurality of openings of a film attached onto the elastic body. The plurality of openings of the film may correspond to the respective openings of the plurality of spaces. The plurality of openings of the film respectively may include a plurality of slits.

According to various embodiments, the plurality of spaces respectively may correspond to positions of the plurality of solder balls on the second substrate.

According to various embodiments, the plurality of spaces may be disposed to be shielded when coupled with the plurality of solder balls.

According to various embodiments, the plurality of pieces included in each of the plurality of solder ball holders may be attached to the elastic body. A gap between the plurality of pieces included in each of the plurality of solder ball holders may increase while the plurality of solder balls respectively enter the plurality of spaces and, when the entry is completed, return to its original gap.

According to various embodiments, the substrate structure may further comprise a second elastomer pin disposed on the first substrate in the plurality of spaces.

According to various embodiments, the substrate structure may further comprise a third elastomer pin disposed on a side surface of the plurality of spaces.

According to various embodiments, the plurality of solder ball holders may be formed of polyimide.

According to various embodiments, the substrate structure may comprise a second substrate to be connected to a plurality of first elastomer pins disposed on the first substrate, a plurality of solder balls mounted on the second substrate, and an anti-solder wicking structure disposed between the second substrate and the plurality of solder balls.

According to various embodiments, the anti-solder wicking structure may include a polyethylene terephthalate (PET) film or a polyimide film.

According to various embodiments, the plurality of solder balls may be mounted on the second substrate while being attached to the film. The film in an area other than a mounting area may be removed after the plurality of solder balls are mounted.

According to various embodiments, the film may include a plurality of solder balls attached in positions corresponding to positions of the plurality of spaces included in the elastic body disposed on the first substrate.

According to various embodiments, in the film, the area corresponding to the positions of the plurality of first elastomer pins may be removed.

According to various embodiments, each of the plurality of solder balls may be mounted in a position on the second substrate corresponding to the positions of the plurality of spaces included in the elastic body disposed on the first substrate.

According to various embodiments, the plurality of solder balls may be disposed to be shielded when coupled to the plurality of spaces.

According to various embodiments, the anti-solder wicking structure may include nickel plating disposed on a surface of the plurality of solder balls.

According to various embodiments, each of the plurality of solder balls may further include a fastening portion fastened to the solder ball holder attached to the elastic body when entering the plurality of spaces included in the elastic body disposed on the first substrate.

It should be appreciated that various embodiments of the disclosure and the terms used therein are not intended to limit the technological features set forth herein to particular embodiments and include various changes, equivalents, or replacements for a corresponding embodiment. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

According to various embodiments, each component (e.g., a module or a program) of the above-described components may include a single entity or multiple entities. Some of the plurality of entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A substrate structure, comprising:
   a first substrate;
   a plurality of first elastomer pins disposed on the first substrate;
   an elastic body disposed on the first substrate to surround the plurality of first elastomer pins, the elastic body including a plurality of spaces for receiving a plurality of solder balls on a second substrate connected to the first substrate; and
   a plurality of solder ball holders disposed in boundary areas of respective openings of the plurality of spaces, wherein each of the plurality of solder ball holders has a higher strength than the elastic body, and
   wherein each of the plurality of solder ball holders includes a plurality of pieces.

2. The substrate structure of claim 1, wherein each of the plurality of solder ball holders has a closed curve shape corresponding to a shape of a boundary of an opening of each of the plurality of spaces.

3. The substrate structure of claim 1, wherein the plurality of solder ball holders are disposed to be spaced apart on boundaries of the respective openings of the plurality of spaces.

4. The substrate structure of claim 1, wherein the plurality of solder ball holders respectively are shaped as a plurality of openings of a film attached onto the elastic body, wherein the plurality of openings of the film correspond to the respective openings of the plurality of spaces, and wherein each of the plurality of openings includes a plurality of slits.

5. The substrate structure of claim 1, wherein the plurality of spaces respectively correspond to positions of the plurality of solder balls on the second substrate.

6. The substrate structure of claim 5, wherein the plurality of spaces are disposed to be shielded when coupled with the plurality of solder balls.

7. The substrate structure of claim 1, wherein the plurality of pieces included in each of the plurality of solder ball holders are attached to the elastic body, and wherein a gap between the plurality of pieces included in each of the plurality of solder ball holders increases while the plurality of solder balls respectively enter the plurality of spaces and, when the entry is completed, returns to its original gap.

8. The substrate structure of claim 1, further comprising: a second elastomer pin disposed on the first substrate in the plurality of spaces.

9. The substrate structure of claim 1, further comprising: a third elastomer pin disposed on a side surface of the plurality of spaces.

10. The substrate structure of claim 1, wherein the plurality of solder ball holders are formed of polyimide.

11. The substrate structure of claim 1, further comprising: an anti-solder wicking structure disposed between the second substrate and the plurality of solder balls.

12. The substrate structure of claim 11, wherein the anti-solder wicking structure includes a polyethylene tere-phthalate (PET) film or a polyimide film.

13. The substrate structure of claim 12, wherein the plurality of solder balls are mounted on the second substrate while being attached to the film, and wherein the film in an area other than a mounting area is removed after the plurality of solder balls are mounted.

14. The substrate structure of claim 11, wherein the anti-solder wicking structure includes nickel plating disposed on a surface of the plurality of solder balls.

15. The substrate structure of claim 11, wherein each of the plurality of solder balls further includes a fastening portion fastened to each solder ball holder attached to the elastic body when entering the plurality of spaces included in the elastic body disposed on the first substrate.

16. The substrate structure of claim 1, further comprising: a plurality of second elastomer pins disposed on the second substrate.

17. The substrate structure of claim 16, wherein the plurality of second elastomer pins disposed on the second substrate in a plurality of spaces.

18. The substrate structure of claim 16, wherein the plurality of second elastomer pins disposed to be spaced apart from each other on side surfaces of the plurality of spaces included in the elastic body.

19. The substrate structure of claim 18, wherein the plurality of solder ball holders are disposed between the plurality of second elastomer pins.

20. The substrate structure of claim 18, wherein the plurality of solder ball holders are disposed on the plurality of second elastomer pins.

\* \* \* \* \*